US007018881B2

(12) United States Patent
Wasshuber

(10) Patent No.: US 7,018,881 B2
(45) Date of Patent: Mar. 28, 2006

(54) SUSPENDED GATE SINGLE-ELECTRON DEVICE

(75) Inventor: Christoph Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/982,730

(22) Filed: Nov. 3, 2004

(65) Prior Publication Data

US 2005/0153484 A1 Jul. 14, 2005

Related U.S. Application Data

(62) Division of application No. 10/448,673, filed on May 30, 2003, now Pat. No. 6,844,566.

(51) Int. Cl.
*H01L 29/8238* (2006.01)
*H01L 29/336* (2006.01)
*H01L 29/3205* (2006.01)

(52) U.S. Cl. ...................... 438/197; 438/299; 438/585; 438/593

(58) Field of Classification Search ................ 438/306, 438/412, 299, 2, 590, 585, 197
See application file for complete search history.

(56) References Cited

U.S. PATENT DOCUMENTS

| | | | | |
|---|---|---|---|---|
| 5,640,022 | A * | 6/1997 | Inai | 257/26 |
| 5,972,744 | A * | 10/1999 | Morimoto et al. | 438/197 |
| 6,198,113 | B1 * | 3/2001 | Grupp | 257/39 |
| 6,344,659 | B1 * | 2/2002 | Ivanov et al. | 257/30 |
| 6,753,546 | B1 * | 6/2004 | Tzalenchuk et al. | 257/31 |
| 6,919,579 | B1 * | 7/2005 | Amin et al. | 257/31 |

OTHER PUBLICATIONS

R.H. Klunder, "Circuit Design With Metallic Single-Electron Tunnel Junctions"; PhD Thesis TU Del., ISBN 90-9016412-X, 2002.

H. Inokawa, A. Fujiwara and Y. Takahashi, "A Multiple-Valued Logic With Merged Single-Electron and MOS Transistors"; Technical Digest of the IEDM, 2001, pp. 147-150.

K. Uchida, T. Tanamoto, R. Obba, S. Yasuda and S. Fujita; "Single-Electron Random Number Generator (RNG) for Highly Secure Ubiquitous Computing Applications"; Technical Digest of the IEDM, 2002, pp. 177-180.

S. Mahapatra, A. Ionescu, K. Banerjee and M. Declercq; "Modelling and Analysis of Power Dissipation in Single Electron Logic"; Technical Digest of the IEDM, 2002, pp. 323-326.

W. Wang and W. Porod, "Single Electron Transistor Analytic I-V Model for Spice Simulations"; Superlattices and Microstructures, vol. 28, No. 5/6, 2000, pp. 345-349.

C. Wasshuber, "Computational Single-Electronics"; Springer Verlag., ISBN 321183558x, 2001.

Simon, A Single Electron Device and Circuit Simulator, http://www.lybrary.com/simon/.

Christoph Wasshuber, "Recent Advances and Future Prospects in Single-Electronics"; To be Presented as Design Automation Conferences, Anaheim, CA, Jun. 4, 2003.

* cited by examiner

*Primary Examiner*—Chuong Anh Luu
(74) *Attorney, Agent, or Firm*—Yingsheng Tung; Wade James Brady, III; Frederick J. Telecky, Jr.

(57) ABSTRACT

The present invention provides a single-electron transistor device (100). The device (100) comprises a source (105) and drain (110) located over a substrate (115) and a quantum island (120) situated between the source and drain (105, 110), to form tunnel junctions (125, 130) between the source and drain (105, 110). The device (100) further includes a movable electrode (135) located adjacent the quantum island (120) and a displaceable dielectric (140) located between the moveable electrode (135) and the quantum island (120). The present invention also includes a method of fabricating a single-electron device (200), and a transistor circuit (300) that include a single-electron device (310).

5 Claims, 8 Drawing Sheets

SUSPENDED GATE SINGLE-ELECTRON DEVICE

TECHNICAL FIELD OF THE INVENTION

This is a divisional application of Ser. No. 10/448,673 filed May 30, 2003 now U.S. Pat. No. 6,844,566, which herein is incorporated by reference in its entirety. The present invention is directed in general to the manufacture of a semiconductor device, and, more specifically, to a single electron transistor and method of fabrication thereof.

BACKGROUND OF THE INVENTION

The continuing demand for increasing computational power and memory space is driving the miniaturization of integrated circuits. To sustain progress, miniaturization will soon be driven into the nanometer regime. Unfortunately, conventional devices cannot be scaled down straightforwardly, because of problems caused by parasitic resistances, scattering and tunneling.

Single-electronics offers solutions to some of the problems arising from miniaturization. Single-electronic devices can be made from readily available materials and can use as little as one electron to define a logic state. Unlike conventional devices, single-electron devices show improved characteristics when their feature size is reduced. This follows from the fact that single-electron devices are based on quantum mechanical effects which are more pronounced at smaller dimensions. Single-electron devices also have low power consumption and therefore there are no energy restrictions to exploit the high integration densities that are possible with such devices.

The practical implementation of single-electronic devices capable of reproducibly defining a logic state remains problematic, however. For instance, it is desirable to develop process technology conducive to the mass production of nanometer scale single-electron devices structures and for such devices to operate at room temperature. Much more important than mass production and room temperature operation, however, is the sensitivity of single-electron devices towards random background charge effects.

A random background charge can alter the Coulomb blockade energy, thereby altering the operating characteristics of the device. For instance, a trapped or moving charge in proximity to a single-electron transistor (SET) logic gate could flip the device's logic state, thereby making the output from the device unreliable at any temperature. In addition, background charge movement can cause the device's characteristics to shift over time.

Previous attempts to reduce the random background charge dependence of single-electronic devices have not been entirely successful. Efforts to find impurity-free fabrication techniques have not lead to devices that are sufficiently free of random background charge. Adding redundancy into the logic circuit is considered to be ineffective, especially in the presence of high background charge noise levels. An operating-point-refresh to adjust the bias conditions of the device is also not considered to be an efficient solution. Accordingly, single-electronic logic devices have heretofore been considered to be impractical due to their sensitivity to random background charge effects, and the consequent instability of the device's logic state.

Accordingly, what is needed in the art is a single-electron device and method of manufacturing thereof that overcomes the above mentioned problems, and in particular minimizes random background charge effects on device function.

SUMMARY OF THE INVENTION

To address the above-discussed deficiencies of the prior art, the present invention provides a single-electron transistor device. The device comprises a source and drain located over a substrate and a quantum island situated between the source and drain, to form tunnel junctions between the source and the drain. The device further includes a movable electrode located adjacent the quantum island.

In another embodiment, the present invention provides a method of fabricating a single-electron device. The method includes forming a source and drain located over a substrate. The method also comprises placing a quantum island between the source and drain, wherein the quantum island forms tunnel junctions between the source and the drain. The method also includes forming a movable gate adjacent the quantum island.

Yet another embodiment of the present invention is a transistor circuit, comprising a single-electron device comprising a source, drain, quantum island and moveable gate as described above, and a metal-oxide semiconductor field-effect transistor (MOSFET) coupled to the single-electron device. The MOSFET is configured to amplify a drain current from the single-electron device.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGS. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages of using single-electron devices that circumvent random background charge effects by using Coulomb oscillations to store and transmit logic states. The term Coulomb oscillations, as used herein, refers to the periodic change in the drain current (Id) for increasing gate voltage ($V_G$) in a single-electron device.

Unlike the Coulomb blockade, the Coulomb oscillation frequency is independent of random background charges.

The present invention further recognizes that the Coulomb oscillation frequency in a single-electron device can be modulated by changing a gate capacitance to the device. Moreover, a change in the logic state of the single-electron device can be accomplished by changing the gate's capacitance using a moveable electrode, for example, such as a gate, to change the Coulomb oscillation frequency. Thus, single-electron devices that can store and transmit logic states by changing the Coulomb oscillation frequency are able to function substantially independently of random background charge effects.

Figure 1A:
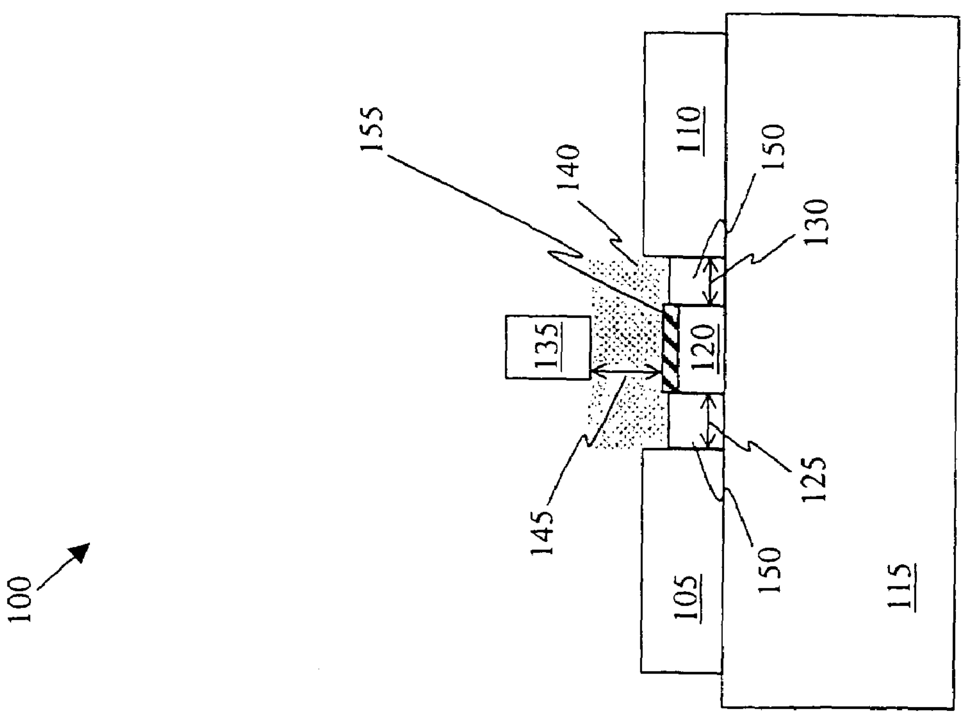
FIGS. 1A and 1B illustrate cross-sectional and top views of an exemplary single-electron transistor device of the present invention.
Figure 1B:
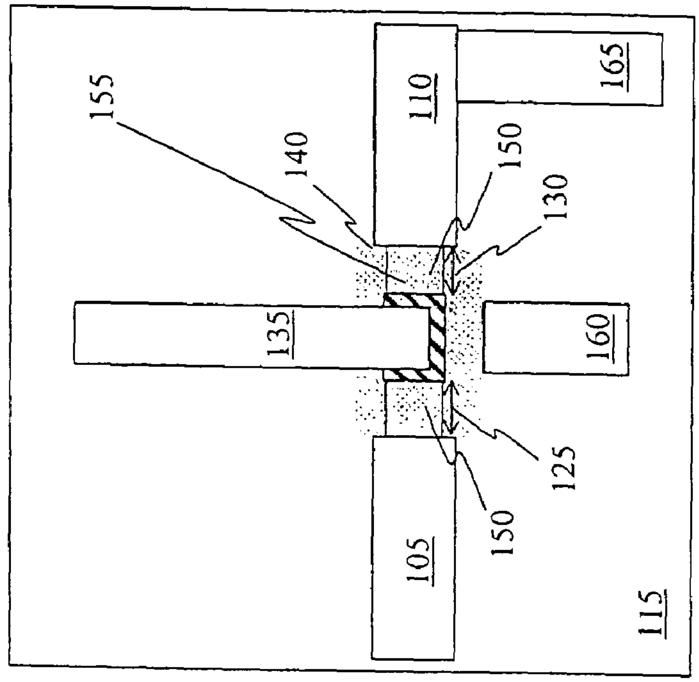

One embodiment of the present invention as shown in FIGS. 1A and 1B, respectively illustrates cross-sectional and top views of an exemplary single-electron transistor device 100 of the present invention.

Turning first to FIG. 1A, the single-electron transistor device 100 comprises a source and drain 105, 110 supported by a substrate 115. While it is shown that the source and drain 105, 110 are located on the substrate 115, other embodiments might provide the source and drain 105, 110 being located within the substrate 115. The substrate 115 is comprised of conventional material, such as silicon. A quantum island 120 is located between the source and drain 105, 110 and forms tunnel junctions 125, 130 between the source and drain 105, 110. A movable electrode 135, which may be a gate, is located adjacent the quantum island 120. In a preferred embodiment, a displaceable dielectric 140 is located between the movable electrode 135 and the quantum island 120. As explained in more detail below, the displaceable dielectric is a material that can be compressed or moved by the moveable electrode 135 to a degree sufficient to decrease the separation distance between the moveable electrode 135 and the quantum island 120. A dielectric material 150 is also located between the quantum island 120 and the source and drain 105, 110. The dielectric material 150 may have the same composition as the dielectric material 140 or it may be different, as explained below.

The term quantum island 120 as used herein refers to the structure between the source and drain 105, 110 that facilitates the movement of discrete electron tunneling from the from the source 105 to the island 120 and from the island 120 to drain 110. Those skilled in the art are familiar with such discrete electron tunneling and with other terms used to refer to the quantum island 120, such as a quantum dot, a grain, a particle or node. For certain conditions and island sizes, a voltage bias applied to the movable electrode 135 polarizes the tunnel junctions 125, 130. This, in turn, changes the Coulomb blockade energy, which is given by $e^2/2C_\Sigma$, where e is the electric charge on one electron, and $C_\Sigma$ is the total capacitance coupled to the quantum island 120. Preferably, the temperature is low enough, and the island 120 is small enough, that the Coulomb blockade energy is large compared to the ambient thermal energy kT (i.e., $e^2/2C_\Sigma >> kT$). Under such conditions, changing the Coulomb blockade energy facilitates tunneling of one or more discrete electrons as described above.

As noted above, the Coulomb oscillation frequency of the drain current can be modulated by changing the gate capacitance of the device. In particular, the periodicity of the Coulomb oscillation is given by $e/C_G$, where $C_G$ is the capacitance between the moveable electrode 135 and the quantum island 120. In certain preferred embodiments of the present invention, the moveable electrode 135 is configured to move with respect to the quantum island 120 to change a capacitance ($C_G$) between the quantum island 120 and the movable electrode 135 when a voltage ($V_G$) is applied to it.

Changing $C_G$ results in a change in the Coulomb oscillation frequency, which, in turn, can be use to encode logic states. In one embodiment, an increased voltage applied to the moveable electrode 135 causes the distance 145 between the electrode 135 and the island 120 to decrease by moving the electrode 135 towards the island 120. A decreased distance 145 between the electrode 135 and the quantum island 120 causes $C_G$, to increase which, in turn, results in a decrease in the Coulomb oscillation frequency. Conversely, a decrease in $V_G$ causes the gate 135 to move away from the island 120, resulting in a decrease in $C_G$, and corresponding increase in the Coulomb oscillation frequency.

In other embodiments, however, increasing $V_G$ causes the moveable electrode 135 to move away from the quantum island 120, while decreasing $V_G$ causes the gate to move towards the island, producing an increase and decrease in the Coulomb oscillation frequency, respectively.

Thus, the distance 145 between the moveable electrode 135 and the quantum island 120 can be adjusted to provide the desired change in $C_G$ and corresponding change in the Coulomb oscillation frequency. In certain embodiments, for instance, it is desirable to apply one of two $V_G$ values, corresponding to binary-encoded information, to the moveable electrode 135. The change in $V_G$ preferably causes a large change in $C_G$ when the moveable electrode 135 travels from one discrete location to another. In certain embodiments, for example, the distance 145 between the moveable electrode 135 and the quantum island 120 is between about 1 nanometers and about 1000 nanometers, and more preferably between 10 and 100 nanometers.

It is preferable for the distance 145 to be less than 200 nanometers, because a small change in distance can cause a large relative change in $C_G$. For example, actuating the moveable electrode 135 from one location to another causes a change in $C_G$ of greater than 10 times, and more preferably greater than 100 times. This, in turn, causes the drain current from the transistor 100 to have one of two distinct Coulomb oscillation frequencies. Preferred Coulomb oscillation frequencies range from about 1 MHz to about 50 GHz.

A large nonlinear change $C_G$ can be facilitated by configuring the moveable electrode 135 so as to contact an insulating material 155 formed on at least a portion of the quantum island 120, when one of two $V_G$ values is applied to the moveable electrode 135. In some embodiments, the insulating layer 155 is made of silicon dioxide and has a thickness of about 1 nanometer, although other insulating materials and thicknesses could be used, as well understood by those skilled in the art.

The moveable electrode 135 can comprise a variety of structures, depending on the desired relationship between $V_G$ and the Coulomb oscillation frequency. For instance, the moveable electrode 135 may have a structure analogous to conventional microelectromechanical structures used in suspended gate field effect transistors or in telecommunication devices. In certain embodiments, for example, the moveable electrode 135 is a cantilevered arm member, such as that depicted in FIG. 1A. In other embodiments, however, the moveable electrode 135 is a suspended membrane.

The single-electron transistor device 100 may have numerous designs, as well understood by those skilled in the art. In some embodiments, it is advantageous for a number of the component parts of the single-electron transistor device to be in substantially the same plane, as illustrated in FIG. 1B. Such configurations are desirable because fabrication is more easily accomplished using conventional processes, such as lithography, as further discussed below.

With continuing reference to FIG. 1B, in certain preferred embodiments, for example, the source and drain 105, 110 and the quantum island 130 are located in substantially a same plane and the moveable electrode 135 is located substantially cut of the plane. In other embodiments, however, the moveable electrode 135 may be located in the same plane as the source and drain 105, 110 and the quantum island 120.

The desired separation between the source and drain 105, 110 and quantum island 120 to form tunnel junctions 125, 130 is well understood by those skilled in the art. For example, the tunnel junctions include a gap material 155 between the source and drain 105, 110 and quantum island 120, of between about 1 nanometer and about 1000 nanometers.

In some embodiments, the gap material 155 includes a dielectric material, such as silicon dioxide, which can be formed by oxidizing a constriction in a silicon wire that also serves as the source and drain 105, 110 and quantum island 120. In other embodiments, the dielectric material comprises aluminum oxide, which may be formed by oxidizing a constriction in an aluminum wire that also serves as the source, drain and quantum island.

The component parts of the single electron transistor 100, including the source and drain, 105, 110 quantum island 120 and moveable electrode 135, can be made of a variety of conventional materials. The source and drain, 105, 110 quantum island 120 and moveable electrode 135 can be made from the same or different materials. Such materials include, but are not limited to silicon, GaAs heterostructures, metals, semiconductors, carbon nanotubes, or single molecules. In certain preferred embodiments, for example, the source and drain 105, 110 and the quantum island 120 comprises doped polysilicon and the moveable electrode comprises aluminum.

In certain preferred embodiments, the displaceable dielectric 140, such as that shown in FIG. 1A, is a gas, such as air, having a high dielectric constant. Alternatively, the displaceable dielectric 140 may be a liquid or semi-solid having a high dielectric constant (e.g., about the same or greater than the dielectric constant of air).

Referring again to FIG. 1B, the single-electron transistor device 100 may further include a fixed gate 160 located adjacent the quantum island 120. In preferred embodiments, the fixed gate 160 is configured to cause a change in a Coulomb blockade energy of the tunnel junctions 125, 130 when a gate voltage is applied to the fixed gate 160. The fixed gate 160 may be made of the same types materials as the source 105, drain 110, quantum island 120 or moveable electrode 135. In certain preferred embodiments, for example, the fixed gate 160 comprises doped silicon.

When present, the inclusion of a fixed gate 160 is advantageous because it provides a broader range of design options. In certain preferred embodiments, for instance, it is desirable to have an alternating current component of a voltage applied to the fixed gate 160 in order to adjust the Coulomb blockade energy associated with the single-electron transistor device over at least two periods of the Coulomb oscillation frequency. In such embodiments, a direct current component of another voltage, encoding binary information, is applied to the moveable electrode 135.

However, in other embodiments having only a moveable electrode 135, the voltage applied to the moveable electrode has both alternating and direct current components. In still other embodiments, the transistor 100 has more than one moveable electrode 135, to facilitate the production of a larger change in $C_G$, and hence Coulomb oscillation frequency, or to allow the generation more than two $C_G$ values and corresponding Coulomb oscillation frequencies.

With continuing reference to FIG. 1B, the single-electron transistor device 100 may further include a filter 165 configured to allow a drain current having a predefined Coulomb oscillation frequency to pass through the filter 165. The filter 165 is preferably a high pass, low pass or band filter, or combination thereof. Additioanlly, the filter 165 can be configured to allow passage of the drain current having one Coulomb oscillation frequency, but not another Coulomb oscillation frequency. In such embodiment, for instance, a first logic state is defined when the drain current passes through the filter while a second logic state is present when no drain current passes through the filter 165.

The present invention also covers a method for manufacturing a single-electron device as those discussed above. FIGS. 2A through 2H illustrate cross sectional, and in some cases, top views at selected steps in fabrication of a single-electron device 200 according to the principles of the present invention. One skilled in the art should understand, however, that similar procedures could be used to form a variety of single-electron devices that fall within the scope of the present invention.

The fabrication of components of the single-electron device 200 can include any number of conventional techniques, including well known lithographic processes.

Figure 2A:
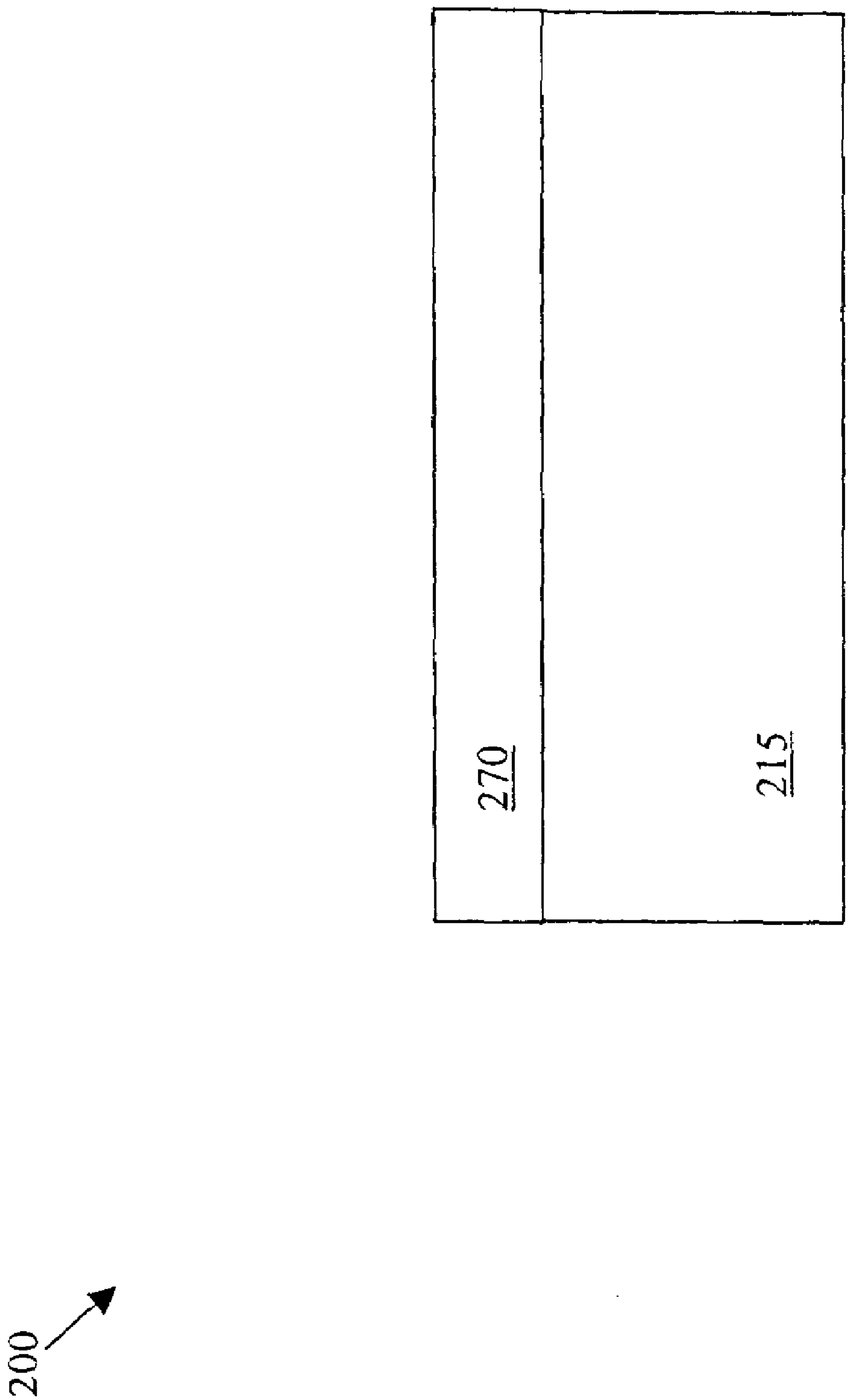
FIGS. 2A to 2H illustrate sectional and top views of selected steps in an exemplary method for fabricating a single-electron device according to the principles of the present invention.
Figure 2C:
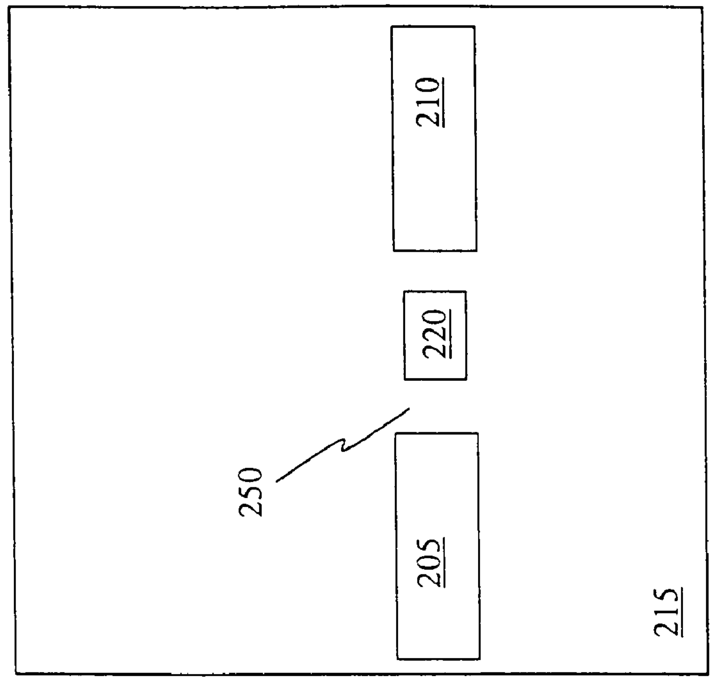
Figure 2B:
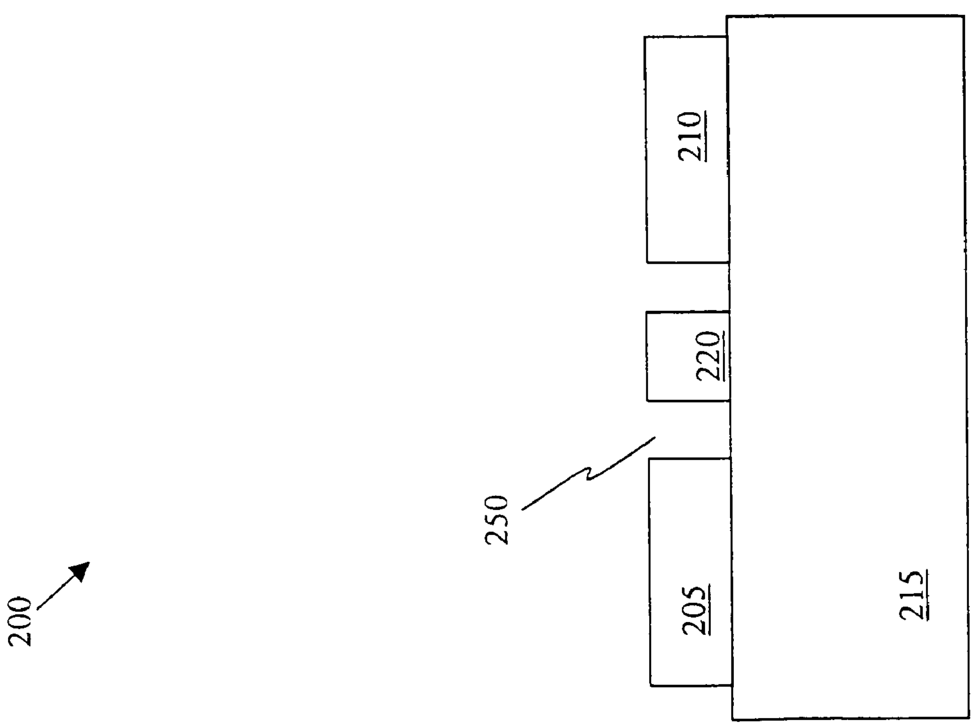

Turning to FIG. 2A, the illustrated embodiment includes forming a conductive layer 270 over substrate 215. The conductive layer 270 is then conventionally patterned to form a source 205 and drain 210 and placing a quantum island 220 between them, as shown in FIGS. 2B and 2C. This pattern, of course, can be replicated any number of times to produce the desired circuit layout. Exposure of portions of the resist to radiation (e.g. ultraviolet or visible light, x-ray, ion beam, electron beam) followed by conventional etching procedures is conducted to lithographically define the source 205, drain 210 and quantum island 220, as shown. One skilled in the art should understand, of course, that in other embodiments, placing the quantum island 220 can be accomplished using other conventional procedures. Such procedures include, for instance, growing a conductive grain or particle using self-assembled growth procedures, such as molecular beam epitaxy or metal-organic chemical vapor deposition. Other techniques can include isolating particular regions of a silicon substrate and subjecting those isolated regions to an oxidizing process in such a way to isolate the quantum island 210 from the source and drain, 205, 210. In such instances, the dielectric material 250, previously referenced as 150 in FIG. 1A, may comprise silicon dioxide. While this particular embodiment is not shown, it is readily apparent to those skilled in the art how to fabricate the device using the isolation method based on this discussion.

Figure 2D:
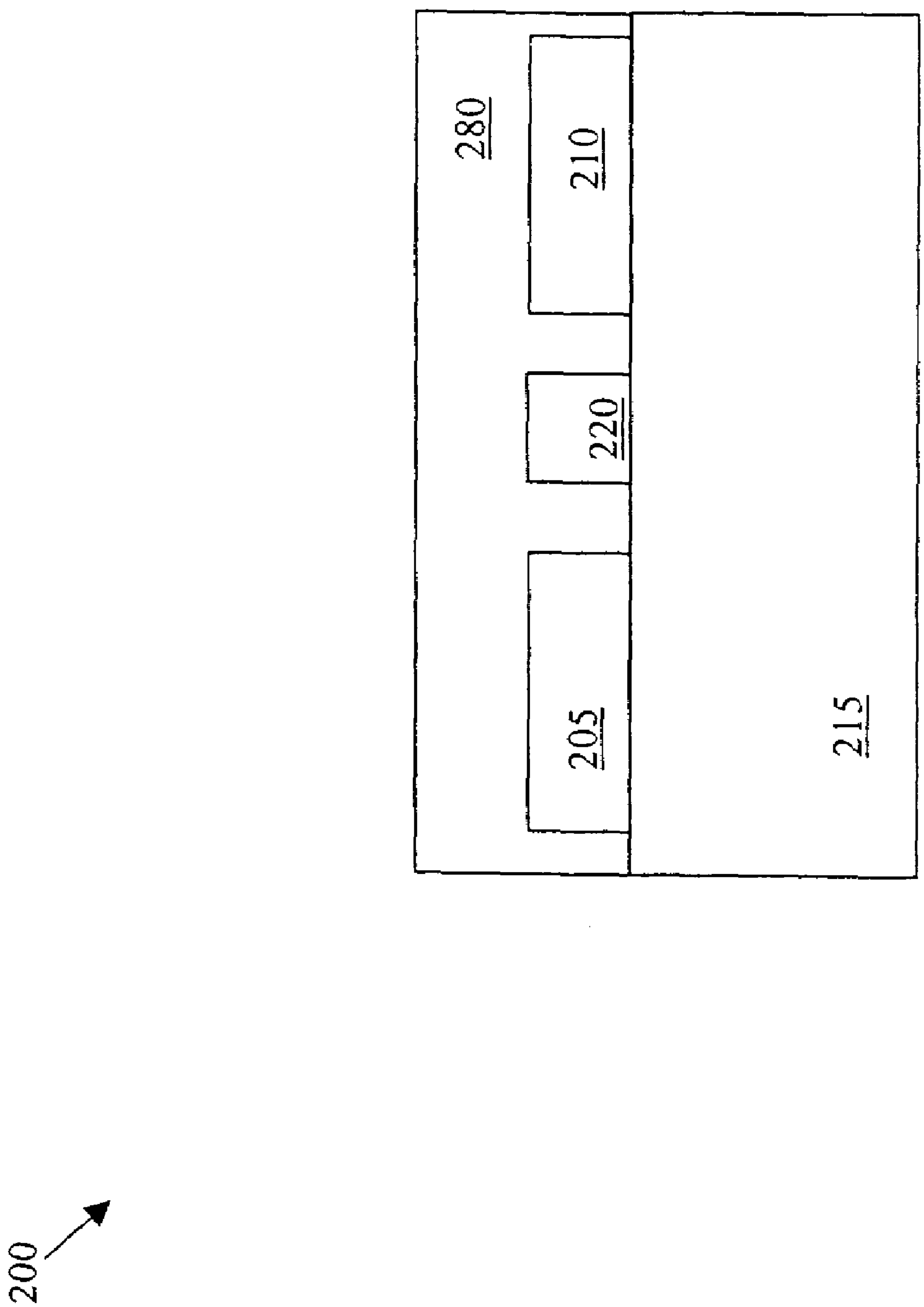
Figure 2E:
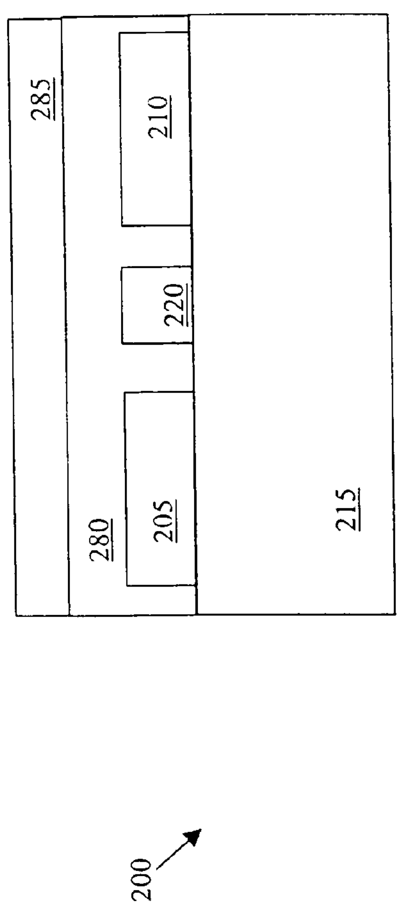
Figure 2F:
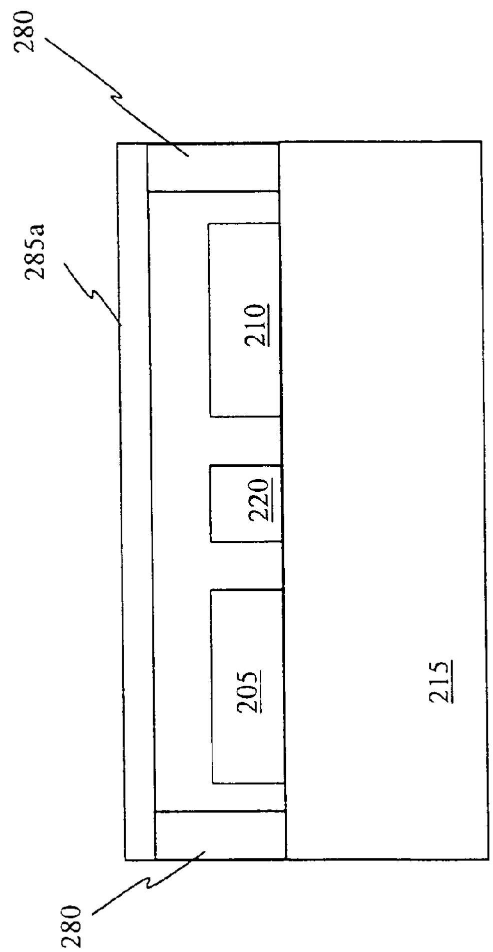

In one advantageous embodiment, the moveable electrode 150 as referenced in FIG. 1A may be a membrane member. In such embodiments, the method includes forming a sacrificial layer 280 over the source and drain 205, 210 and the quantum island 220, as shown in FIG. 2D. Preferably, the sacrificial layer comprises silicon dioxide, although other materials well known to those skilled in art could be used. Subsequent to this, an ultra thin conductive layer 285 is deposited on the sacrificial layer 280 (FIG. 2E). The thickness of the conductive layer 285 should be thin enough to provide enough flexibility such that it can be moved under a voltage bias. Those who are skilled in the art would be able to determine the appropriate thickness from application to another. The conductive layer 285 is then patterned on the sacrificial layer 280 to form an electrode 285_a_ (FIG. 2F). A substantial portion of the sacrificial layer 280 is then removed from underneath the conductive layer 285 using well known etching techniques, which leaves the electrode 285_a_ supported by a portion of the sacrificial layer 280 at an outer perimeter of the electrode 285_a_, as shown. The sacrificial layer 280 may be etched using conventional underetch processes, such as dry etching, used to form microelectromechanical devices. This etching process leaves a gap, which is typically filled with air but might be occupied with another material as mentioned above, such that the electrode 285_a_ can move toward the quantum island 220 when subjected to the appropriate voltage. Moreover, due to the ultra thin nature of the electrode 285_a_, it is easily deformable such that when biased with the appropriate voltage, it can bend or move toward the quantum island 220.

Figure 2G:
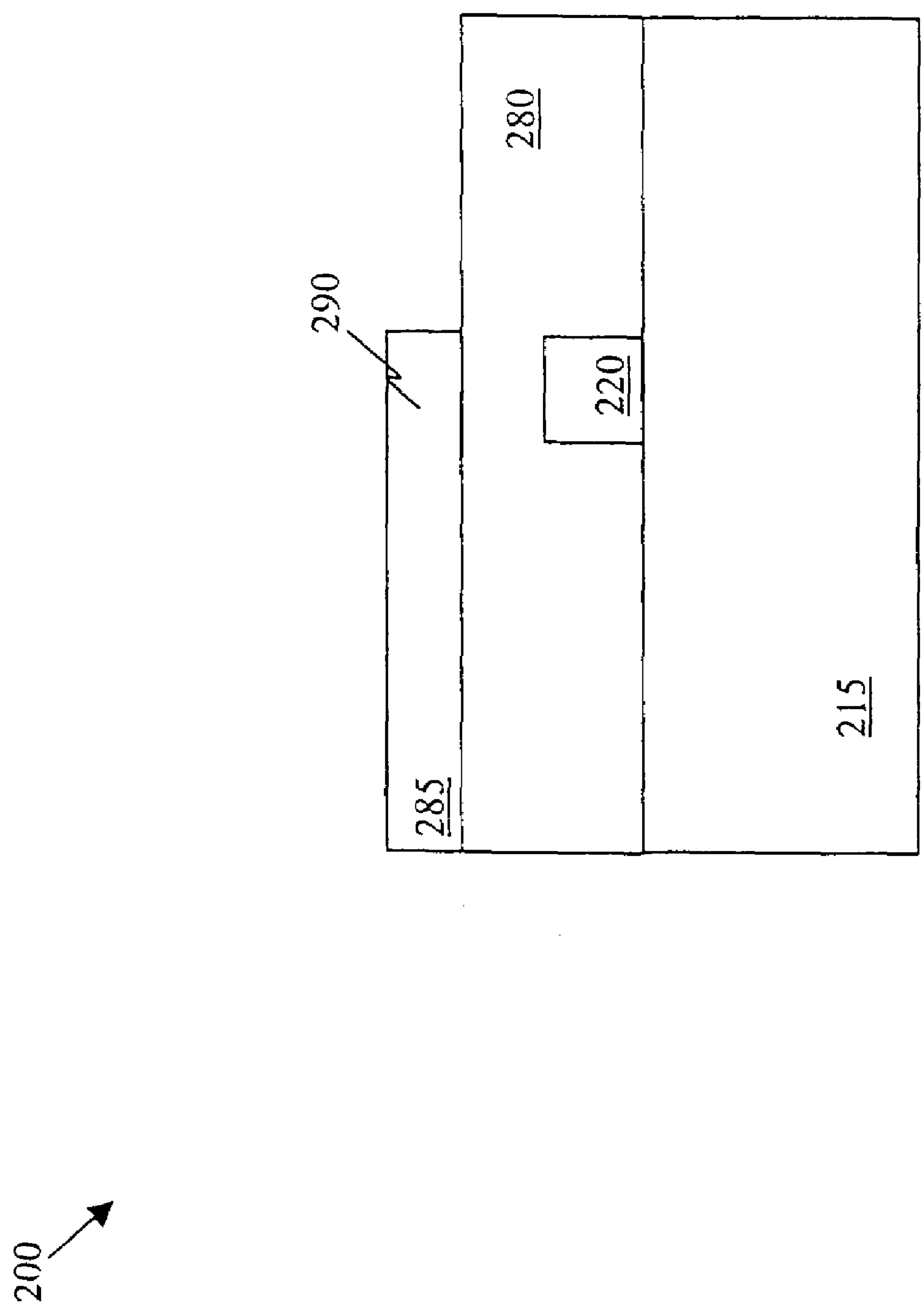
Figure 2H:
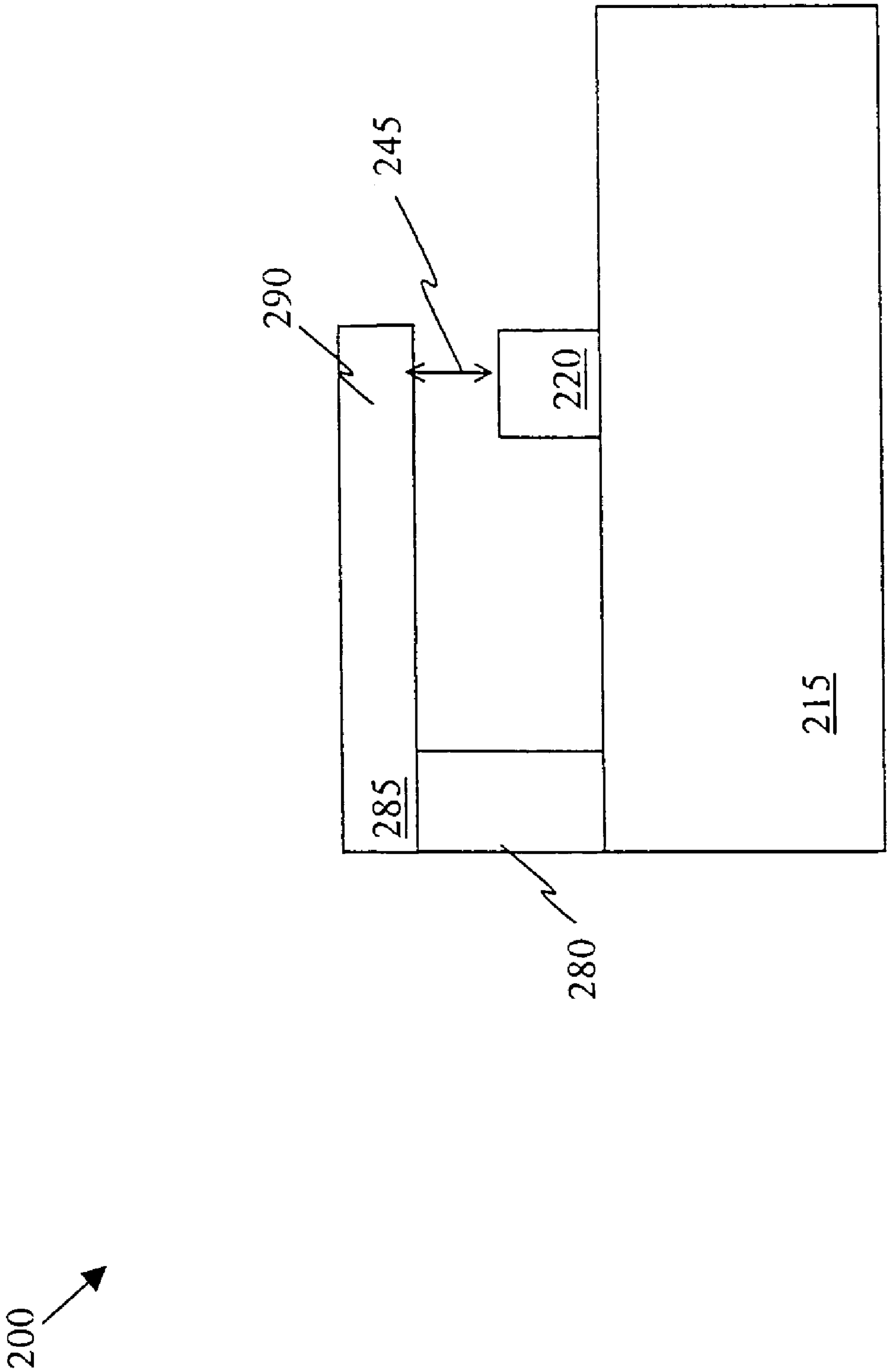

Another embodiment of the moveable electrode 150 as referenced in FIG. 1A is shown in FIG. 2G. In such embodiments, the conductive layer 285 is deposited over the sacrificial layer 280, as discussed above. The conductive layer 285 is then patterned and a substantial portion of the sacrificial layer 280 is removed to form the movable electrode 290. As with other embodiments, the removal of the sacrificial layer 280 leaves a gap between the moveable electrode 290 and the quantum island 220 (FIG. 2H). However, the electrode 290 is cantilevered from the remaining portion of the sacrificial layer 280 such that it can be moved toward the quantum island 220 when subjected to the appropriate voltage.

Figure 3:
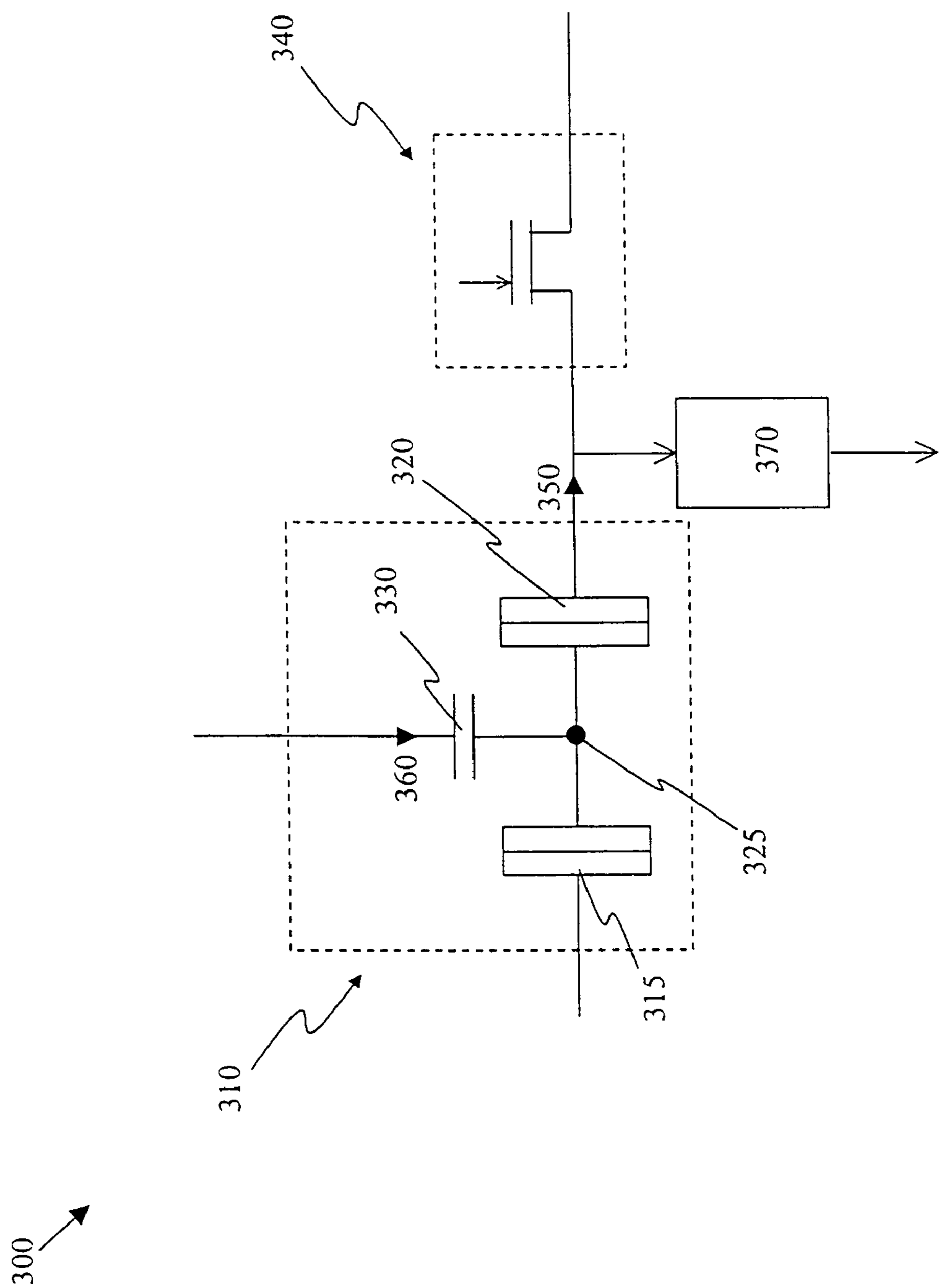
FIG. 3 presents a circuit diagram of an exemplary transistor circuit of the present invention.

Yet another embodiment of the present invention, transistor circuit 300, is schematically illustrated in FIG. 3. The transistor circuit 300 comprises a single-electron device 310 of the present invention, including a source and drain 315, 320, quantum island 325 and moveable electrode 330. The single-electron device 310 may comprise any of the previously discussed embodiments of the single-electron transistor device and illustrated in FIGS. 1_a_ and 1B. The transistor circuit 300 further includes a conventional metal-oxide semiconductor field-effect transistor (MOSFET) 340 coupled to the single-electron device 310. The MOSFET 340 is configured to amplify a drain current 350 from the single-electron device 310.

One skilled in the art would understand that the transistor circuit 300 advantageously improves the voltage gain of drain current 350 from the single-electron device 310 and thereby facilitate the use such circuits 300 in forming multiple logic levels. In certain preferred embodiments of the transistor 300, the movable gate 330, is configured to move with respect to the quantum island 325 to change a capacitance between the quantum island 325 and the movable gate 330 when a voltage 360 is applied to the movable gate 330.

In certain preferred embodiments of the transistor circuit 300, the voltage 360 applied to the moveable electrode 330 is configured to contain binary information. In still other preferred embodiments, for example, when the voltage 360 has a first amplitude, the drain current 350 will a first Coulomb oscillation frequency between about 0.1 and about 1.0 GHz, which, in turn, corresponds to a first logic state. When voltage 360 has a second amplitude, the drain current 350 has a second Coulomb oscillation frequency between about 10 and about 20 GHz that corresponds to a second logic state.

Certain preferred embodiments of the transistor circuit 300, further include a filter 370 coupled to the single-electron device 310 and the MOSFET 340. As discussed previously, the filter 370 can be advantageously configured to allow the drain current 350 to pass through the filter when the drain current 350 has a predefined Coulomb oscillation frequency, and thereby facilitate the defining logic states in the circuit 300.

Although the present invention has been described in detail, one of ordinary skill in the art should understand that they can make various changes, substitutions and alterations herein without departing from the scope of the invention.

What is claimed is:

1. A method of fabricating a single-electron device, comprising:

forming a source and drain within or on a substrate;

placing a quantum island between said source and drain, said quantum island forming tunnel junctions between said source and said drain; and forming a movable electrode adjacent said quantum island.

2. The method as recited in claim 1, wherein forming said source and drain includes forming a conductive layer over said substrate and patterning said conductive layer.

3. The method as recited in claim 2, wherein placing said quantum island includes patterning said conductive layer.

4. The method as recited in claim 3, wherein forming said quantum island and said source and drain are formed during said patterning.

5. The method as recited in claim 1, wherein forming said moveable electrode includes:

forming a sacrificial layer over said source and drain and said quantum island;

forming a conductive layer on said sacrificial layer; and removing a portion of said sacrificial layer so as to form a gap between said conductive layer and said quantum island.

* * * * *